(12) United States Patent
Rahmatullah et al.

(10) Patent No.: US 6,195,782 B1
(45) Date of Patent: Feb. 27, 2001

(54) MLSE IMPLEMENTATION USING A GENERAL PURPOSE DSP AND SHARED HARDWARE FOR A GSM APPLICATION

(75) Inventors: Muhammad M. Rahmatullah, Tustin, CA (US); Tony E. Sawan; Philip Yip, both of Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/086,098

(22) Filed: May 28, 1998

(Under 37 CFR 1.47)

(51) Int. Cl.[7] .................................................. H03M 13/03
(52) U.S. Cl. .............................................................. 714/796
(58) Field of Search ................... 714/794, 795, 714/796, 786; 375/341, 262

(56) References Cited

U.S. PATENT DOCUMENTS 5,263,033 * 11/1993 Seshadri ................................ 714/792
5,673,294 * 9/1997 Namekata ............................. 375/341

OTHER PUBLICATIONS

Lou, Viterbi Decoder Design for The IS–95 CDMA Forward Link, IEEE, pp. 1346–1350, May 1996.*
Simplified Viterbi Processors for the GSM Pan–European Cellular Communication System, Giuliano Benelli et al., IEEE Transactions on Vehicular Technology, vol. 43, No. 4, Nov. 1994, pp. 870–877.

Design of a Disgital MLSE Receiver for Mobile Radio Communications, E. Del Re et al.; GLOBECOM'91, IEEE 1991, pp. 1469–1473.

9.6.2 The Trellis Diagram, Edward A. Lee et al., Digital Communiations, Second Edition, 1994, pp. 413–424.

* cited by examiner

Primary Examiner—Albert De Cady
Assistant Examiner—Shelly A Chase
(74) Attorney, Agent, or Firm—Conley, Rose & Tayon; Jeffrey C. Hood

(57) ABSTRACT

A digital signal processor (DSP), hardware module, and shared memory coupled together to perform Viterbi decoding on a sequence of received symbols. Given channel coefficients, the DSP calculates initial data for Viterbi processing: combination values for each possible state and branch product values for each possible symbol. These values are stored in shared memory for access by the hardware module. The DSP further calculates the first few stages of the Viterbi processing so path metrics are well defined for every state. Path metric values are also stored into the shared memory. The hardware module is optimized to perform calculations associated with a single stage of the Viterbi algorithm. The DSP invokes by the hardware module by passing a received sample to the hardware module. The hardware module calculates a survivor state value and minimizing path metric value for each state in the state space.

20 Claims, 8 Drawing Sheets

MLSE IMPLEMENTATION USING A GENERAL PURPOSE DSP AND SHARED HARDWARE FOR A GSM APPLICATION

FIELD OF THE INVENTION

This invention is related to the field of channel equalization in the context of cellular radio communication, and particularly to a combined hardware and software MLSE equalizer structure in the GSM cellular radio system.

DESCRIPTION OF THE RELATED ART

In the GSM cellular radio system, base stations and mobile units transmit and receive digitized voice data in the 900 MHz band. The 890–915 MHz band is reserved for mobile-to-base transmissions (up link), and the 935–960 MHz band is reserved for base-to-mobile transmissions (down link). These bands are divided into channels which are 200 kHz wide. A pair of channels, an up link channel and a down link channel, separated by 45 MHz is described by an Absolute Radio Frequency Channel Number (ARFCN). In normal communications each mobile unit is assigned an ARFCN, asserting its transmissions over the up link channel, and receiving base station transmissions over the down link channel.

Each base station is capable of operating over several ARFCNs. Furthermore, on each ARFCN the base station may be in contact with up to eight mobile units. The mobile units share an ARFCN by a scheme of Time-Division Multiple Access (TDMA), wherein communications over the up link and down link channels are divided into frames, and each frame is further sub-divided into eight time-slots. Each of the eight mobile units is assigned a time-slot number and is expected to confine its transmissions on the up link channel to the corresponding time-slot, and to receive downlink transmissions in the corresponding time-slot. Thus the GSM transmitter (base or mobile) must assemble speech data into bursts (of length 148 bits). When asserting the burst during a time-slot, the transmitter shapes the power envelope of the transmitter RF signal in conformity with a GSM power-ramping time-mask. The power envelope is used by the receiver (base or mobile) to detect the start of the burst and to synchronize its A/D sampling.

The GSM transmitter uses the Gaussian Minimum-Shift Keying (GMSK) modulation technique, in which the binary speech data is embedded onto a baseband signal that modulates the carrier with a bit rate of 270833 bits per second. The modulated carrier is transmitted into the atmosphere as an RF signal. The receiver accepts the RF signal from the atmosphere, and down-converts this RF signal to produce a baseband signal. Due to the effects of the atmosphere or transmission channel, the received baseband signal is a distorted version of the transmitted baseband signal. The distortions include atmospheric channel fading, multipath, noise, and the distortions imposed by the RF stages of the transmitter and receiver.

A typical GSM receiver structure includes: an RF stage which converts the received RF signal into a baseband signal; an analog-to-digital (A/D) converter which samples the baseband signal at a rate of 270833 samples per second, i.e. once per bit interval, to produce a sequence of received samples; a channel estimator which estimates parameters describing the transmission channel on a burst by burst basis; and a Viterbi equalizer which uses the channel parameters to demodulate the binary speech data from the A/D samples.

In the 900 MHz band transmissions are subject to channel fading and multipath, which results in significant inter-symbol interference (ISI). Furthermore, the RF stages of the transmitter and the receiver are non-ideal, and exhibit their own transfer characteristics. The channel estimator is designed to estimate parameters which describe the transmission channel, i.e. estimate the transfer function of the transmission channel. In this application, the transmission channel is interpreted to include one or more (preferably all) of the signal stages between the transmitted baseband and received baseband signals. Thus the transmission channel includes one or more of the following: the RF stage of the transmitter, the atmospheric medium, and the RF stage of the receiver. The channel estimator assumes that the transmission channel can be modeled as a discrete-time linear system, and calculates the impulse response of this linear model.

To facilitate the estimation procedure for the transmission channel impulse response, each transmitted burst contains known training data. In particular, every burst, which comprises 148 successive bits, contains a training sequence of length 26 bits. The channel estimator uses the samples of the received burst and the known training sequence in its estimation algorithm. The Viterbi equalizer uses the transmission channel impulse response, i.e. the transfer function calculated by the channel estimator, to process the received samples and compensate for the ISI. In doing so, the Viterbi equalizer demodulates the encoded binary speech data.

The GSM Specification imposes a limit on the bit error rate (BER) of a GSM receiver with the constraint of a five-tap complex channel model. In order to reduce the effect of ISI on symbol detection, GSM receivers typically use a Viterbi Decoder based on a Maximum Likelihood Sequence Estimation criteria. However, the complexity of the MLSE algorithm imposes a significant computational burden on the equalizer. Thus, an MLSE Equalizer is not always realizable in terms of software running on a general purpose digital signal processor (DSP). Thus, it is desirable to investigate the possibility of partitioning the MLSE equalizer computations between a general purpose DSP and specialized hardware.

SUMMARY OF THE INVENTION

The present invention comprises a composite software and hardware system for decoding a sequence of symbols embedded in a received baseband signal. The hardware module is optimized to perform calculations in the decoding algorithm which are computationally intensive and repetitive in nature. The software module running on a general purpose digital signal processor (DSP) pre-calculates parameters used by the hardware module, and interprets the results produced by the hardware module. Thus, the present invention may advantageously achieve an optimal distribution of processing tasks between the software module and hardware module to maximize the efficiency and accuracy of the decoding algorithm.

In the preferred embodiment of the present invention, the baseband signal is supplied to a sampling device such as an A/D Converter. The sampling device produces a sequence of received samples from the baseband signal. A general purpose digital signal processor (DSP) calculates a set of channel coefficients based on portion of the symbol sequence which are known apriori. For example, in the GSM signaling standard, the mid-amble bits are predetermined and are designed to facilitate channel estimation.

After the channel coefficients become available, the DSP calculates a plurality of combination values associated with a state space. A state comprises an ordered collection of four symbol values. One combination value is calculated for each possible state. A combination represents the effect of an assumed past history on a candidate sample value. Furthermore, the DSP calculates a plurality of branch product values. The branch product values represent the effect of an assumed current symbol on the candidate sample value. The combination value and branch products values are stored into shared memory for later use by a hardware module. The hardware module is specialized to perform all the calculations associated with one stage of the Viterbi algorithm. However, before the hardware module can be invoked, a path metric value must be defined for each state in the state space. Thus, the DSP performs the first few stages of the Viterbi algorithm so that each state is assigned a well-defined path metric value. The DSP also loads the computed error values for each state into shared memory.

The DSP invokes the hardware module by writing a received sample to the hardware module. In response to the received sample, the hardware module accesses the shared memory for combination values, branch product values, and error values, and performs the calculations associated with one stage of the Viterbi algorithm. This involves calculating a survivor state value and the minimizing path metric for each state in the state space.

The hardware module is designed to maximize the efficiency of addressing for data parameters, i.e. the combination values, branch product values, and error values. Furthermore, the number of hardware components are minimized by serializing the hardware data paths. In other words, components are arranged in a serial fashion whenever possible to maintain minimun area and power consumption.

The present invention further contemplates a shared memory coupled between the DSP and the hardware module. In one embodiment of the invention, the shared memory comprises dual ported RAM to minimize extra read/write operations in fetching and/or storing any needed data.

BRIEF DESCRIPTION OF THE DRAWINGS

A better understanding of the present invention can be obtained when the following detailed description of the preferred embodiment is considered in conjunction with the following drawings, in which:

FIG. 7, collectively comprising

Figure 1:
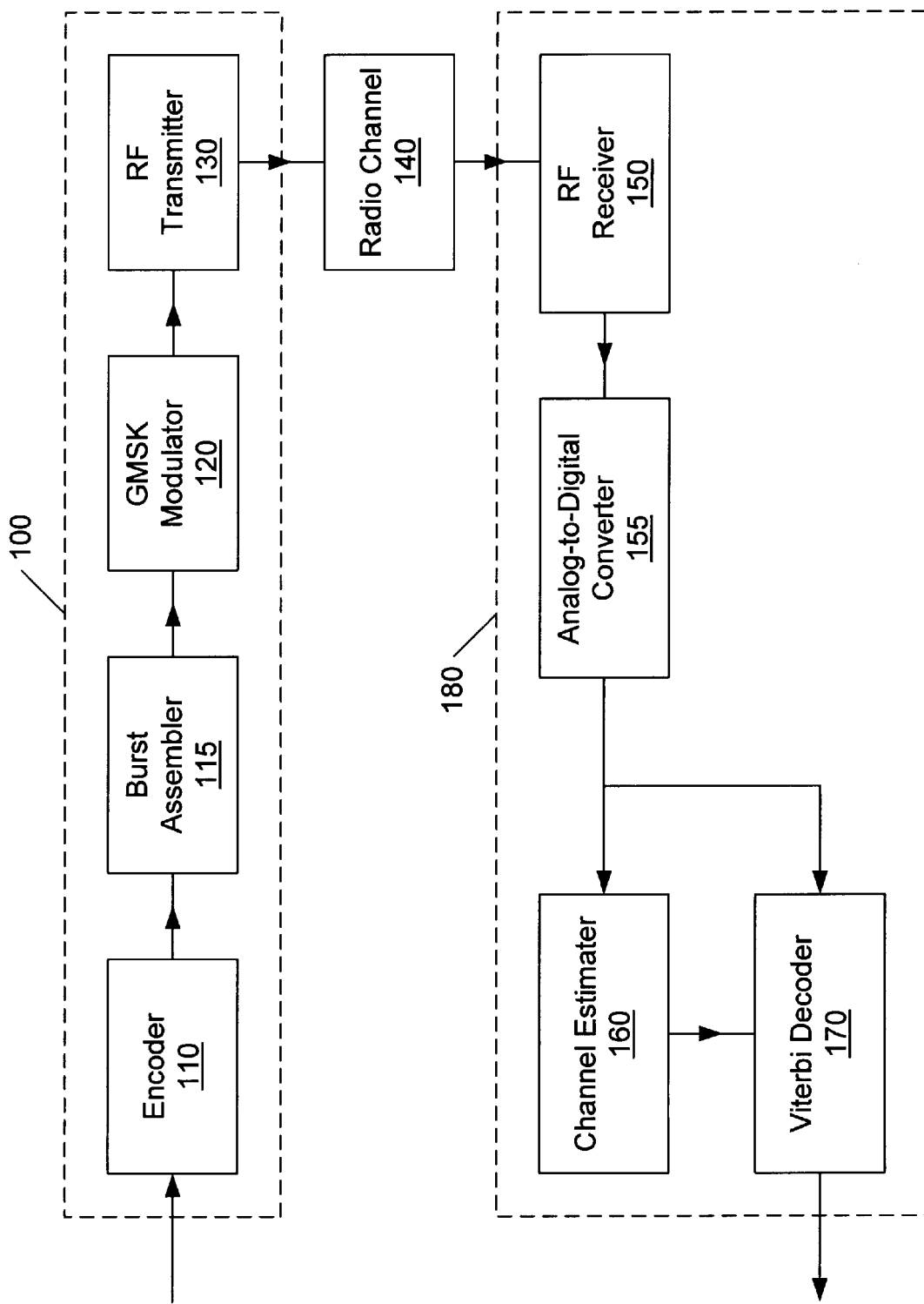
FIG. 1 is a block diagram of the GSM transmission system according to the present invention.

While the invention is susceptible to various modifications and alternative forms specific embodiments are shown by way of example in the drawings and will herein be described in detail. It should be understood however, that drawings and detailed description thereto are not intended to limit the invention to the particular forms disclosed. But on the contrary the invention is to cover all modifications, equivalents and alternatives following within the spirit and scope of the present invention as defined by the appended claims.

DETAILED DESCRIPTION OF THE PREFERRED EMBODIMENT

Referring now to FIG. 1, a block diagram of a GSM transmission system is shown. The present invention is preferably used in a GSM system, and the invention is described below with reference to a GSM system. However, it is noted that the present invention can be used in other communication systems and/or with other communication standards, as desired.

The GSM transmission system comprises a GSM transmitter 100, a Radio Channel 140, and a GSM receiver 180. The GSM transmitter 100 comprises an Encoder 110, a Burst Assembler 115, a GMSK Modulator 120, and an RF Transmitter 130. The GSM Receiver 180 comprises an RF Receiver 150, an Analog-to-Digital (A/D) Converter 155, a Channel Estimator 160, and a Viterbi Decoder 170.

The Encoder 110 receives a stream of sampled voice data and performs speech and channel coding as well as encryption. The resulting bit stream is assembled into bursts of length 148 bits by the Burst Assembler 115. The assembled bursts are modulated using Gaussian Minimum-Shift Keying in the GMSK Modulator 120. The resulting baseband signal is imaged onto an RF carrier and transmitted by the RF Transmitter 130. The transmitted RF signal experiences a host of distortion phenomenon as it propagates through the atmosphere, all of which are summarized by the functional block denoted Radio Channel 140. The distortions include channel fading, multipath, and noise. The RF Receiver 150 accepts the RF signal from the atmosphere, and down-converts this RF signal to generate a baseband signal. The received baseband signal is a distorted version of the transmitted baseband signal.

The A/D Converter 155 samples the received baseband signal at a rate of 270833 bits per second, and supplies the samples to the Channel Estimator 160 and Viterbi Decoder 170.

The Channel Estimator 160 uses the baseband signal samples to calculate, on a burst by burst basis, the impulse response or transfer function of the transmission channel, which includes one or more of the RF Transmitter 130, the Radio Channel 140, and the RF Receiver 150. The Channel Estimator 160 provides the impulse response, also called the channel estimate or channel parameters, to the Viterbi Decoder 170. The Viterbi Decoder 170 uses the channel estimate in a Maximum Likelihood Sequence Estimation algorithm to demodulate the data bits from the received baseband samples $\{y_0, y_1, y_2, y_3 \ldots, y_{147}\}$.

The Viterbi Algorithm

The Viterbi Decoder 170 performs maximum likelihood sequence estimation according to the Viterbi algorithm. The Viterbi algorithm takes as input the following data: (1) the receive samples $\{y_0, y_1, y_2, y_3 \ldots, y_{147}\}$ of the baseband signal, and (2) the estimated impulse response $\{h_0, h_1, h_2, h_3, h_4\}$ calculated by the Channel Estimator 160. The Viterbi algorithm produces as output a sequence of symbols $\{a_0, a_1, a_2, a_3, \ldots, a_{147}\}$ which optimally approximate the originally transmitted symbols.

Let $\Omega$ be a set of symbols. In the preferred embodiment of the invention, the symbol set $\Omega = \{\pm 1, \pm j\}$. Each of the estimated symbols $a_0, a_1, a_2, a_3, \ldots$ are samples from the symbol set $\Omega$.

Define the state space S to be the set of 4-tuples $(v_1, v_2, v_3, v_4)$ whose members $v_1, v_2, v_3, v_4$ are taken from the symbol set $\Omega$, i.e. $S=\Omega^4$. Thus, in the preferred embodiment, the state space S contains $256=4^4$ states. Given a state $v \in S$, the combination $C(v)$ corresponding to v is defined as $$C(v) = h_1 v_1 + h_2 v_2 + h_3 v_3 + h_4 v_4,$$

where $V=(v_1, v_2, v_3, v_4)$.

Figure 2:
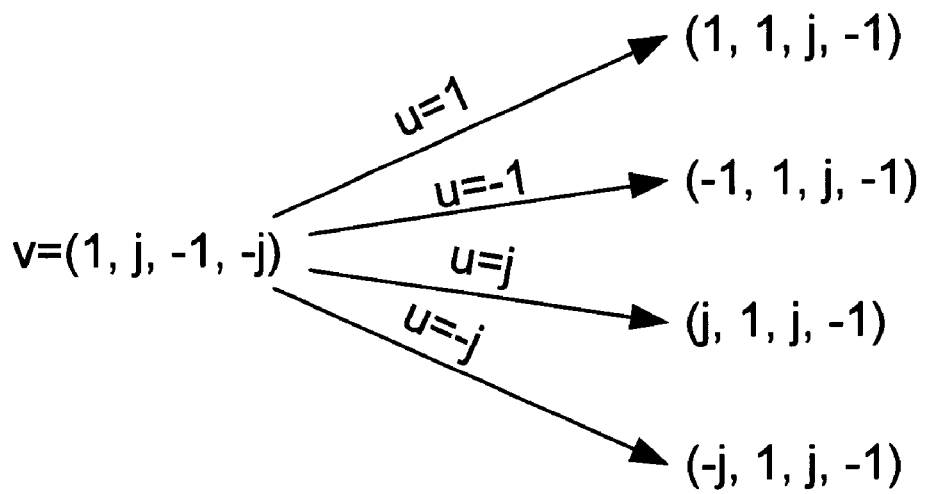
FIG. 2 illustrates branches emanating from a given state.

Given a state $v=(v_1, v_2, v_3, v_4)$ and a symbol u from the symbol set $\Omega$, the symbol u is said to generate a branch from v to a new state (u, v1, v3, v4), where the members of state v have been shifted to the right, and the symbol u injected into the first position of the new state. Thus, given a state v, there are as many branches emanating from v as there are symbols in the symbol set $\Omega$. See FIG. 2 for illustrative examples of branches from a state $v=(1, j, -1, -j)$. As shown, the symbol $u=1$ generates a branch to the state $(1, 1, j, -1)$. The symbol $u=-1$ generates a branch to the state $(-1, 1, j, -1)$. The symbol $u=j$ generates a branch to the state $(j, 1, j, -1)$. Finally, the symbol $u=-j$ generates a branch to the state $(-j, 1, j, -1)$.

Given a branch from a state $v=(v_1, v_2, v_3, v_4)$ to a state w generated by a symbol u, the signal value $\hat{r}_{v,u}$ associated with the branch is defined by the expression $$u \cdot h_0 + C(v).$$

Notice that the signal value $\hat{r}_{v,u}$ depends both on the state v which sources the branch and the symbol u which generates the branch.

Figure 3:
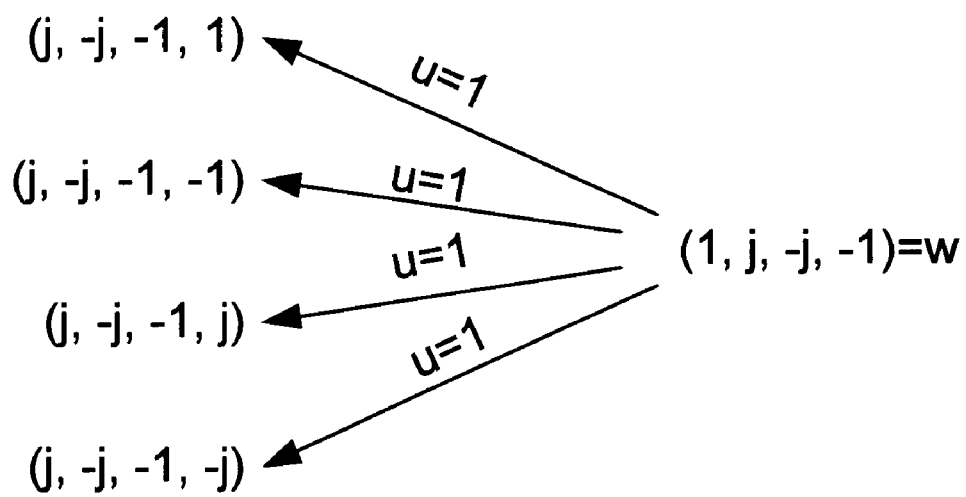
FIG. 3 illustrates branches terminating on a given state.

Given a state $w=(w_1, w_2, w_3, w_4)$, there exist several states which generate a branch to w. Namely, any state v of the form $(w_2, w_3, w_4, x)$ in conjunction with the symbol $w_1$ will generate a branch to state w. Since the symbol x is arbitrary, there are as many branches terminating on w as there are symbols in the symbol set $\Omega$. See FIG. 3 for illustrative examples of branches terminating on a state $(1, j, -j, -1)$.

Figure 4A:
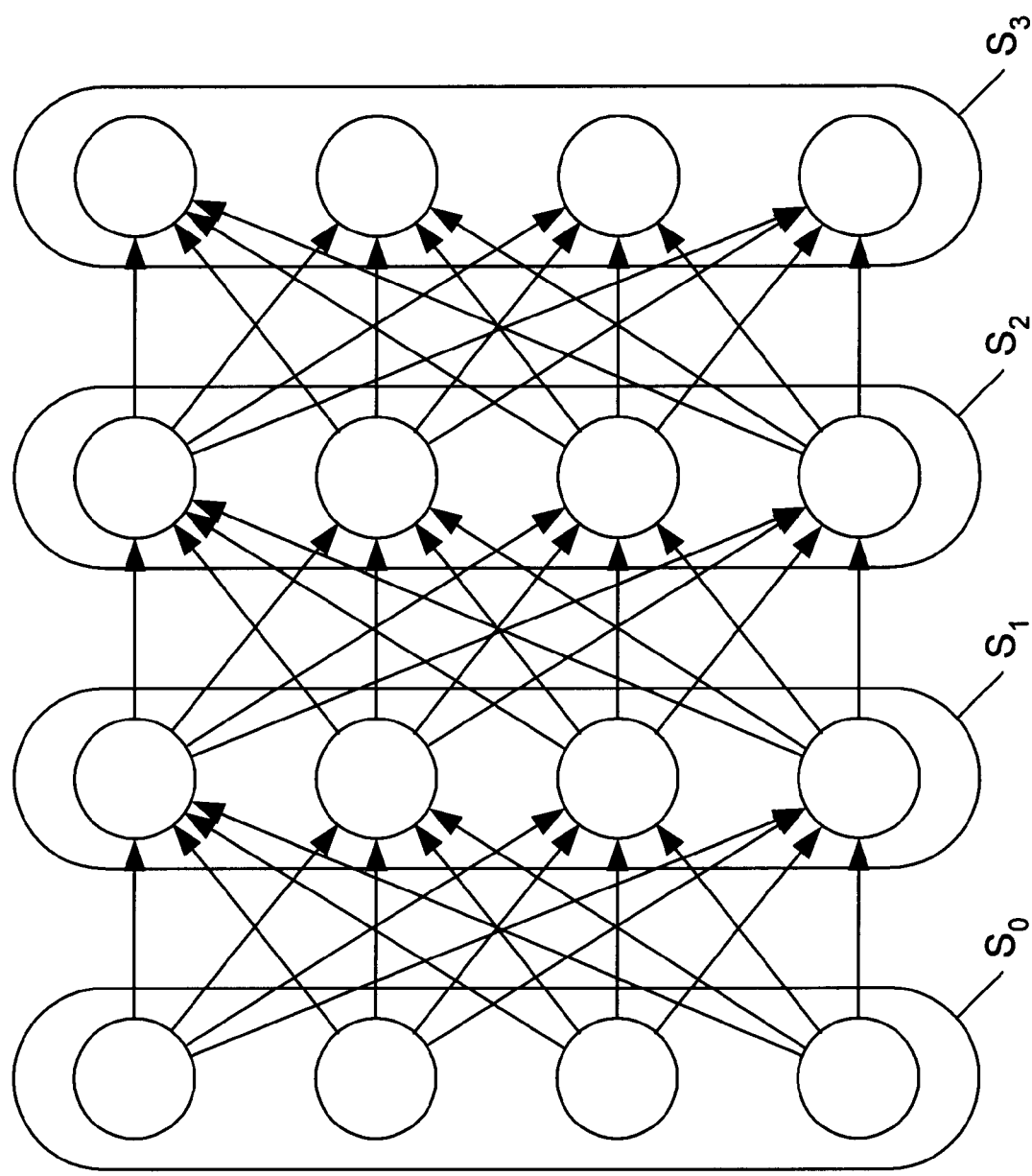
FIG. 4A is a trellis diagram with four copies of the state space S, and three transitional stages.

Consider a trellis diagram generated by a succession of identical copies $S_0, S_1, S_2, S_3, \ldots, S_N$ of the state space S. Branches emanate from each state space $S_k$ and terminate in the succeeding state space $S_k+1$. In particular, each state v in $S_k$ serves as the source for four branches which terminate on states in $S_k+1$. Furthermore, each state w in $S_k+1$ serves as the termination of four branches which emanate from states in $S_k$. The branches terminating on w are said to be candidate branches. One of the candidate branches will be chosen as a "survivor" branch based on an error minimization criteria to be explained below. FIG. 4A shows a trellis diagram with four copies of the state space S, and three transitional stages. It is noted that only a few states are shown in each state space in order to reduce the complexity of the diagram. The directions of branches is from the left to the right.

Each branch of the trellis diagram has an associated branch metric. Each path through the trellis diagram has a path metric which is the sum of the branch metrics for the branches composing the path. According to the maximum likelihood criteria, the best estimate for the transmitted symbol sequence $b_0, b_1, b_2, b_3, \ldots, b_{N-1}$ is given by the path through trellis diagram which achieves a minimum path metric. The Viterbi algorithm is based on the observation that this minimization can be achieved recursively at each stage of the trellis diagram.

Each transitional stage of the trellis diagram is associated with a received sample. Namely, the transition from state space $S_k$ to state space $S_{k+1}$ is associated with received sample $r_k$. Given a state $v=(v_1, v_2, v_3, v_4)$ in state space $S_k$ and symbol u from the symbol set $\Omega$, the branch emanating from v and generated by u has a branch metric $\Delta_{v,u}$ defined by $$\Delta_{v,u} = (r_k - \hat{r}_{v,u})^2 = [r_k - u \cdot h_0 - C(v)]^2.$$

Given a state v in state space $S_k$, consider all the paths through the trellis diagram which terminate at v. Of these paths, the one which achieves a minimum path metric is said to be the surviving path to v. The path metric of the surviving path to v is stored in a variable $e_k(v)$ associated with v. Suppose, that surviving paths have been calculated for each state in state space $S_k$. It is noted that this includes storing the path metric for the surviving path to v for each state v in the state space.

Given a state w in state space $S_{k+1}$, the surviving path terminating upon state w is determined as follows. For each of the states v in $S_k$ which send a branch to w, compute the candidate path metric $e_k(v) + \Delta_{v,u}$, where u is the symbol which generates the branch from v to w. The branch which achieves a minimum candidate path metric is chosen to be the surviving branch. The state v* which sources the surviving branch is said to be the survivor state for w. The surviving path terminating on w is equal to surviving path terminating on v* augmented with the branch from v* to w. The path metric of the surviving path, i.e. the minimizing path metric, is stored in a variable $e_{k+1}(w)$ associated with state w. It is noted that the path metric values $e_k(v)$ may be discarded once all of the path metric values $e_{k+1}(w)$ have been calculated.

Figures 4B, 5:
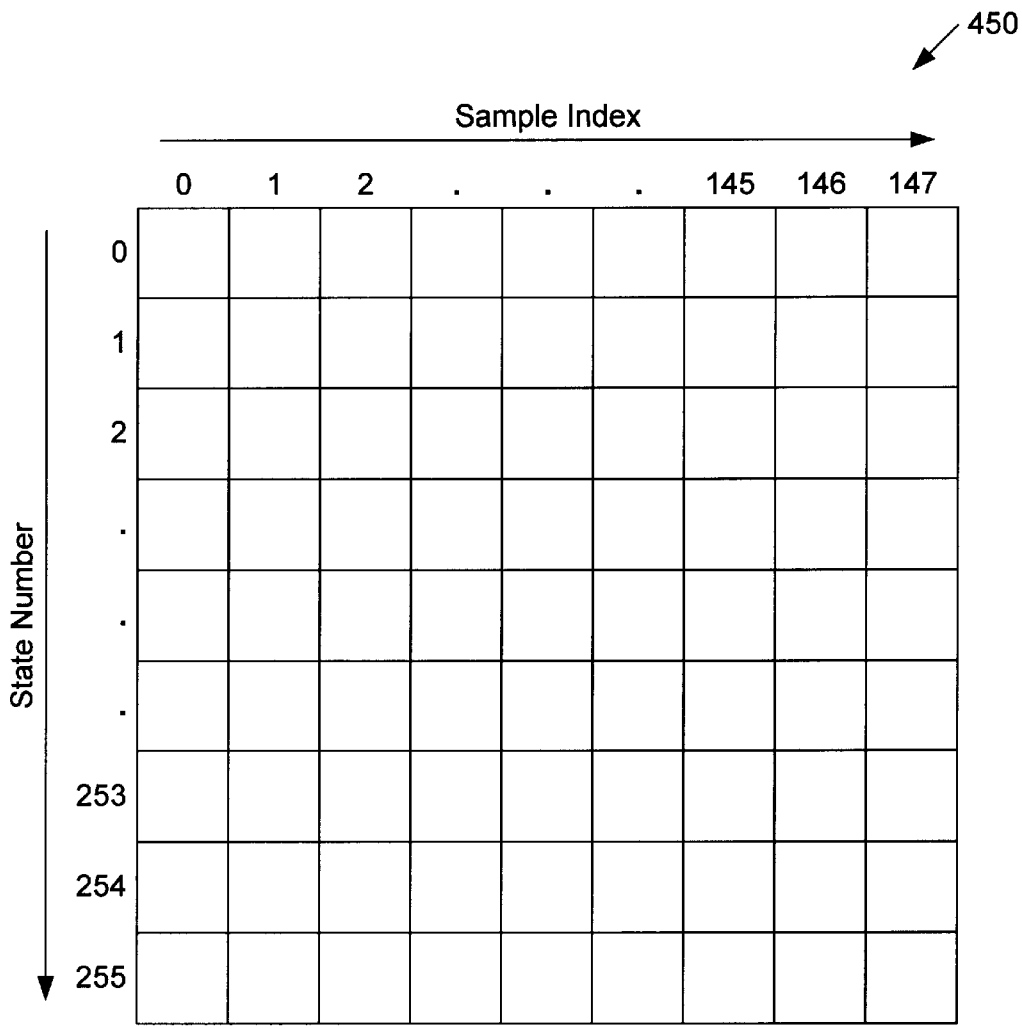
FIG. 4B illustrates the structure of the survivor state array according to the present invention.
FIG. 5 shows a typical path through the trellis diagram.

Referring now to FIG. 4B, the structure of a survivor state array 450 is shown. As will be explained below, each state in the state space S may be assigned a unique state number. For each state w in state space $S_{k+1}$, the state number of the survivor state v* is stored in survivor state array 450. Equivalently, the survivor state v* may be summarized by its last symbol, since the survivor state v* may be reconstructed from state w and the last symbol of survivor state v*. Thus, it suffices to store a representation of the last symbol of the survivor state v* instead of the state number of v*. The survivor state array is indexed by state number and sample index. When all the stages of the trellis diagram are completed, these stored survivor state numbers allow the trellis diagram to be back-traced to determine the optimal path through the diagram.

After the surviving state has been determined for each state w in $S_{k+1}$, the algorithm proceeds to calculate survivor states for states w in state space $S_{k+2}$ using received sample $r_{k+1}$. When the last stage is reached, each state w in the last state space $S_N$ has a unique surviving path terminating on it. The optimal path for the whole trellis diagram is determined by minimizing the path metric $e_N(w)$ with respect to states w in $S_N$. The state w* which minimizes the path metric $e_N(w)$ defines the optimal path through the trellis diagram.

Since a GSM burst starts with a series of four zero bits, a realizable path through the trellis diagram must start with state (0,0,0,0) in state space $S_0$. It follows that a realizable path may achieve any of the four states with the form (a,0,0,0) in state space $S_1$. In state space $S_2$, a realizable path may achieve any of the sixteen states of the form (b,a,0,0). In fact, state space $S_4$ is the first state space for which every state has a realizable path terminating upon it. Thus, a stable path metric value does not exist for every state until state space $S_4$. Recall that the path metric for a state is defined as the path metric of the surviving (minimizing) path which terminates at that state.

Each path through the trellis diagram defines a symbol sequence. Referring now to FIG. 5, an illustrative path is shown. The state $v_1=(1, -1, i, i)$ in state space $S_0$ initiates the path. The symbol $u_1=-1$ generates a branch to the state $v_2=(-1, 1, -1, i)$. The next symbol $u_2=i$ generates a branch to the state $v_3=(i, -1, 1, -1)$. The next symbol $u_3=1$ generates the last branch to the state $v_4=(1, i, -1, 1)$. This path correspond to the symbol sequence $\{rev(v_1), u1, u2, u3\}=\{i, i, -1, 1, -1, i, 1\}$, where rev() denotes the order reversal operator. The first four symbols are the symbols of the initial state $v_1$ is reverse order. The remaining symbols of the symbol sequence are the successive symbols which generate the branches of the path from the first stage to the last stage.

The symbol sequence corresponding to the optimal path is recovered by back-tracing the surviving branches starting from state w*, the surviving state of the last stage. Recall that the survivor state array 450 stores an indication of the survivor state for each state in each stage of the Viterbi algorithm. Thus, the trellis diagram is easily back-traced using this stored information.

Viterbi Decoder Architecture

Figure 6:
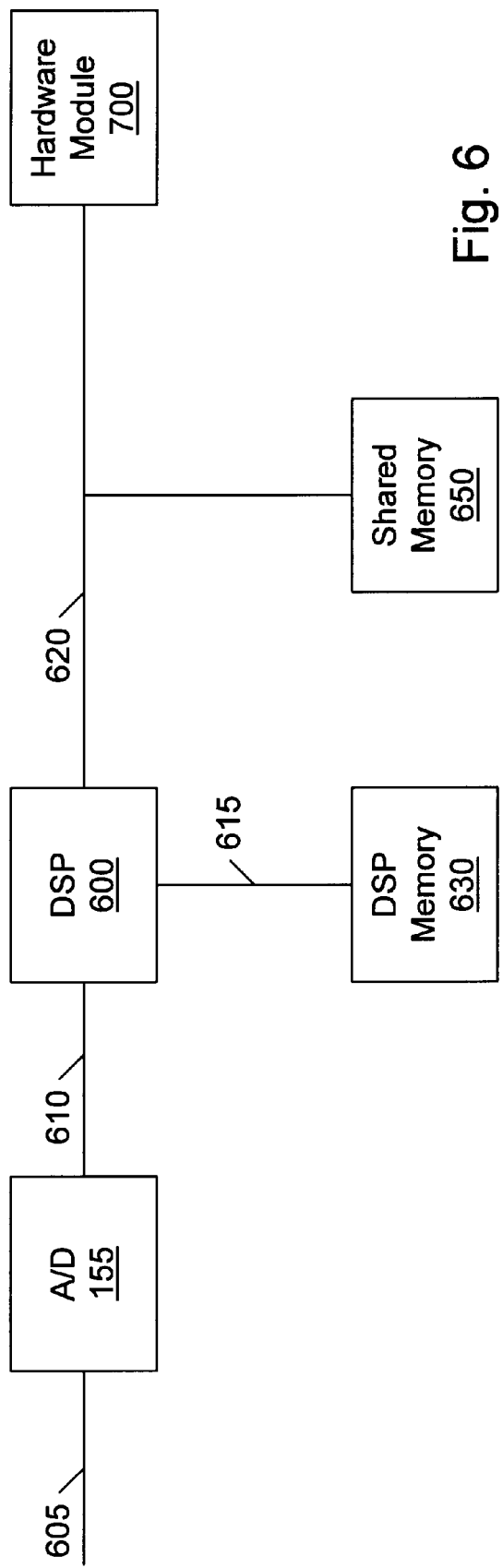
FIG. 6 illustrates the hardware architecture of the present invention.

FIG. 6 illustrates the hardware architecture of the present invention. The hardware architecture includes A/D Converter 155, digital signal processor (DSP) 600, DSP Memory 630, Shared Memory 650, and Hardware Module 700. The A/D Converter receives a baseband analog signal from the RF Receiver 150 (not shown) through conductor 605. The A/D Converter 155 is coupled to DSP 600 through interface bus 610. The DSP 600 is coupled to DSP Memory 630 through a memory bus 615. The DSP 600, Shared Memory 650, and Hardware Module 700 are coupled through an internal bus 620.

The A/D Converter 155 digitizes the analog baseband signal presented on conductor 605, and supplies the digitized samples to DSP 600 through interface bus 610. DSP 600 executes a software module which implements a GSM receiver structure. In particular, the software module performs the functions associated with Channel Estimator 160 and Viterbi Decoder 170.

Figure 8:
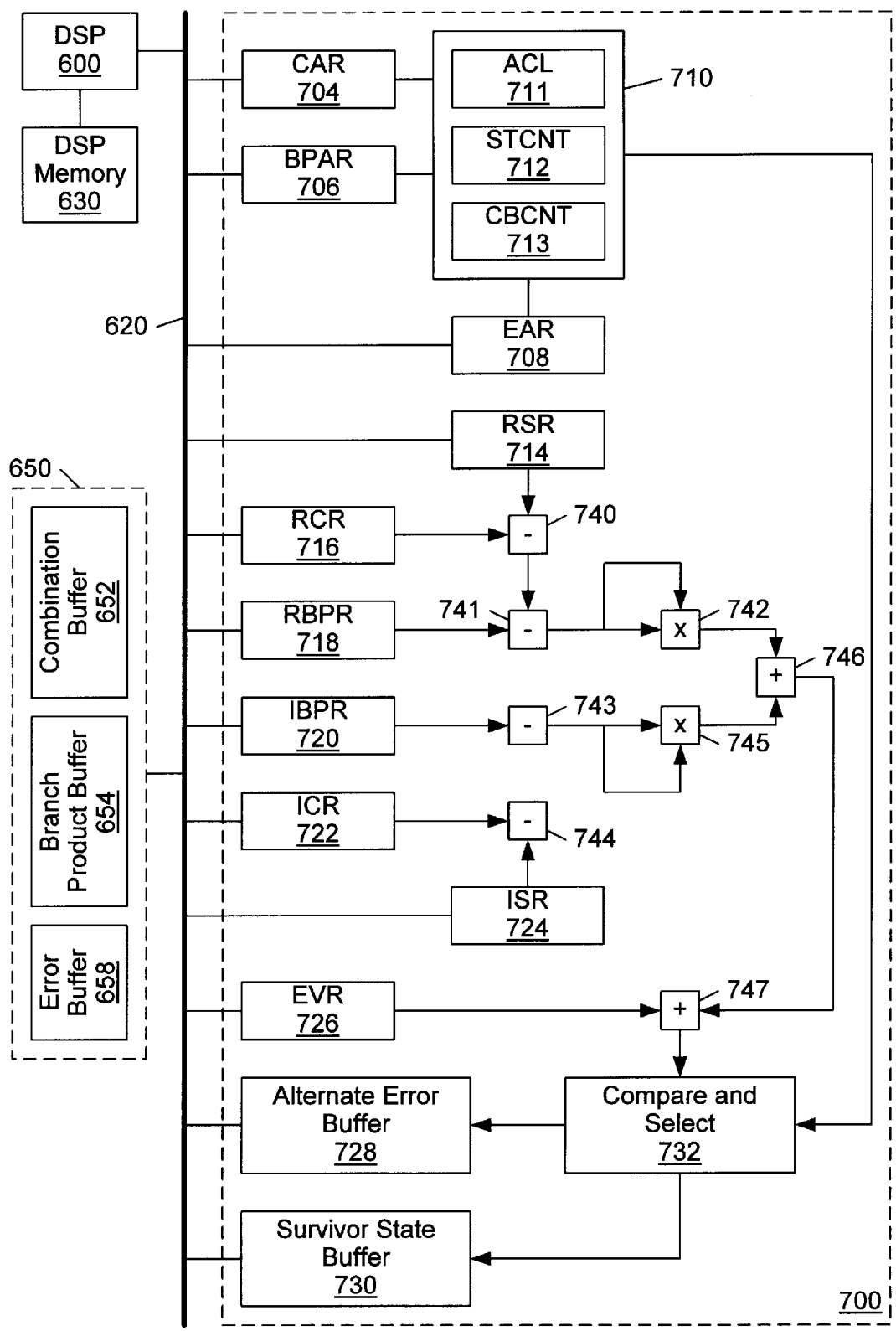
FIG. 8 presents an architecture diagram of the hardware module 700 according to the present invention.

DSP Memory 630 preferably includes survivor state array 450. Shared Memory 650 preferably includes a Combination Buffer 652, a Branch Product Buffer 654, and an Error Buffer 658 as shown in FIG. 8. The Combination Buffer 654 is used to store combination values C(v) which are calculated by DSP 600. The Branch Product Buffer 654 is used to store a plurality of branch product values ($h_0 \cdot u$) which are calculated by DSP 600. The Error Buffer 658 is used generally to store path metric values (also known as error values) which are calculated by DSP 600 or hardware module 700. DSP 600 initially loads the Error Buffer 658 with path metric values. Subsequently, the hardware module 700 updates the path metric values in the Error Buffer 658 as it performs successive stages of the Viterbi algorithm.

FIG. 7: The General Operation of Viterbi Decoder 170

Figure 7A:
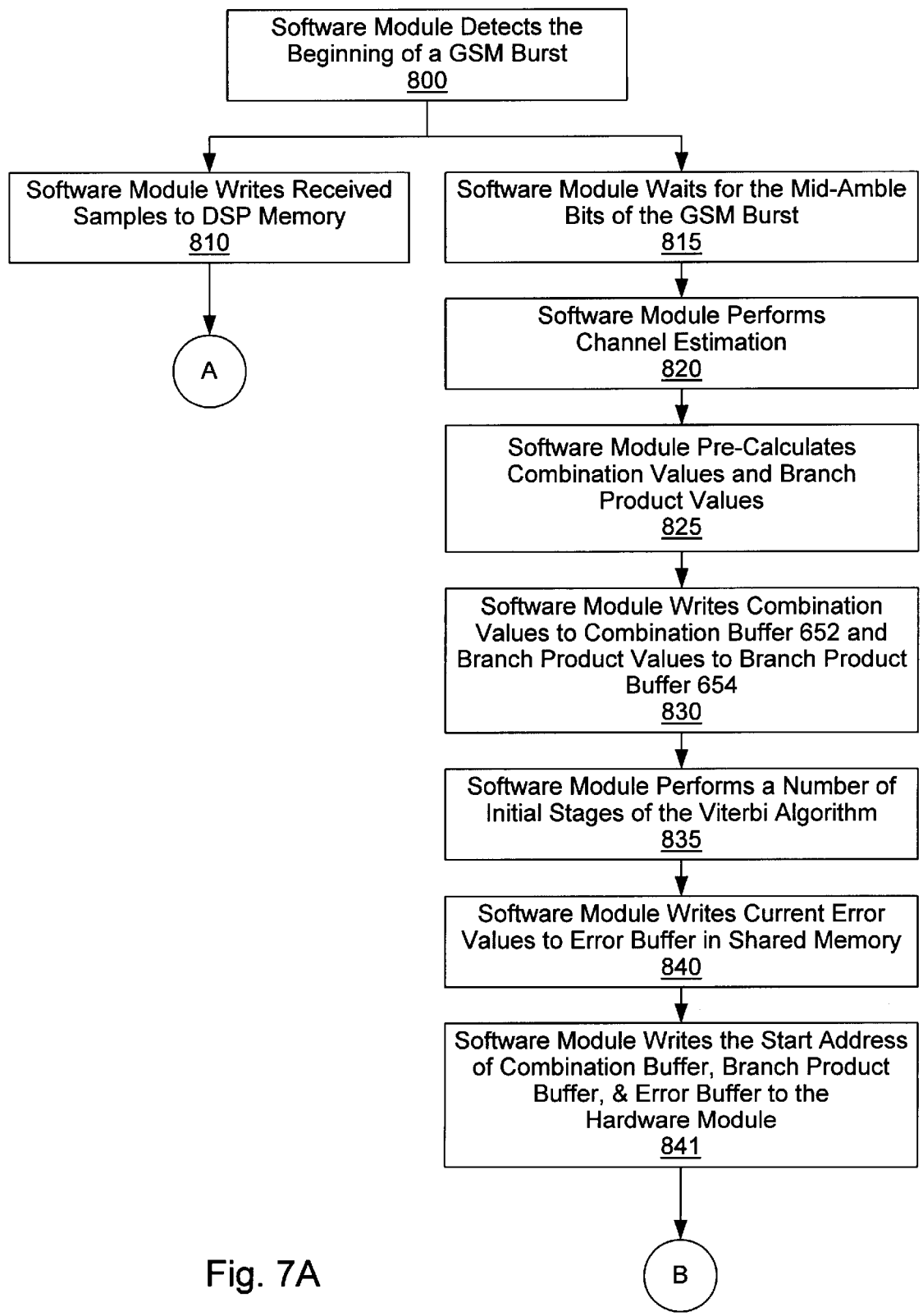
FIGS. 7A and 7B, presents a flowchart for the processing steps performed by the Viterbi Decoder 170 of the present invention.
Figure 7B:
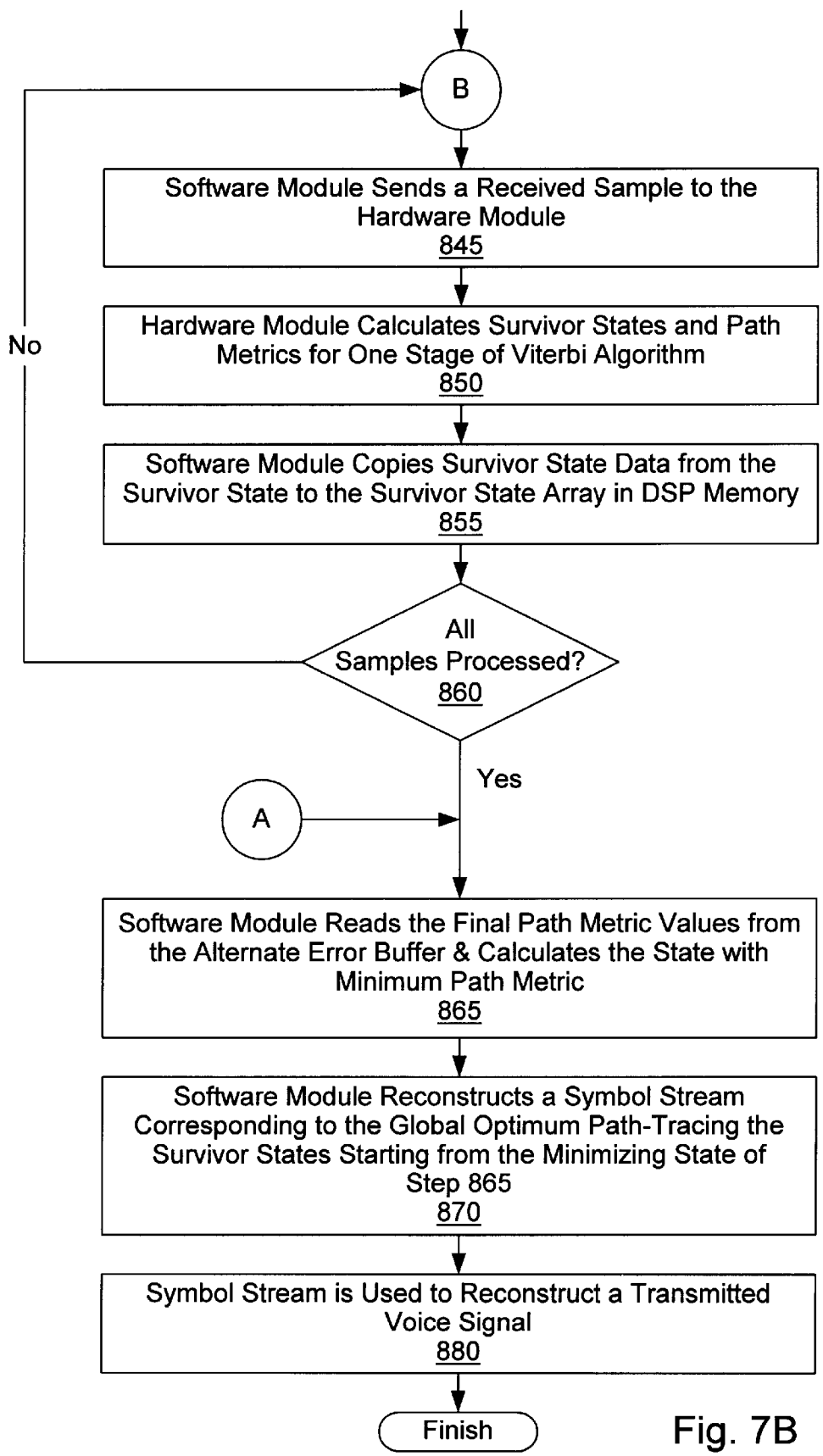

FIG. 7, collectively comprising FIGS. 7A and 7B, presents a flowchart for the processing steps performed by the Viterbi Decoder 170 of the present invention. In step 800, the software module detects the beginning of a GSM burst. In step 810, the software module writes the successive samples of the GSM burst to DSP Memory 630. In parallel with step 810, the software module performs a number of steps starting with step 815. In step 815, the software module waits for the mid-amble bits of the GSM burst. Once the mid-amble bits have been acquired, the software module performs channel estimation as shown in step 820. The channel estimation procedure produces a set of channel coefficients ($h_0, h_1, h_2, h_3, h_4$). After channel estimation, in step 825, the software module calculates the combination values C(v) and branch product values ($h_0 \cdot u$) for each state v in the state space S and symbol u in the symbol set $\Omega$. See discussion of the Viterbi algorithm above.

In step 830, the software module writes the combination values C(v) to the combination buffer 652 in shared memory 650, and writes the branch product values to the branch product buffer 654 also in shared memory 650.

In step 835, the software module performs the Viterbi calculation for a number of the initial stages of the trellis diagram. In the preferred embodiment of the invention, the software module performs the first four stages of the trellis diagram. Furthermore, in state space $S_0$, state (0,0,0,0) is assigned an error value of zero, while all other states are assigned an error value of plus infinity. This ensures that for every state v in state space $S_4$, the surviving path terminating on v will correspond to a realizable path starting from (0,0,0,0) in $S_0$. It is noted other embodiments of the invention are contemplated where the number of initial stages of the trellis diagram computed by the software module may be greater than or less than four.

In step 840, the calculated error values e(w) for the states w in state space $S_4$ are written into the error buffer 658 of shared memory 650. In step 841, the software module writes the start addresses of the combination buffer 652, the branch product buffer 654, and the error buffer 658 to the hardware module 700. The hardware module 700 preferably includes registers to hold these start address values.

In step 845, the software module sends a received sample to the hardware module 700. In particular, the received sample comprises a complex quantity with a real part and an imaginary part. The real part is written to the Real Sample Register (RSR) 714 of the hardware module 700, and the imaginary part is written to the Imaginary Sample Register (ISR) 724.

In response to receiving the received sample (real and imaginary parts), the hardware module 700 accesses data from shared memory 650 and performs the calculations associated with one stage of the Viterbi algorithm as shown in step 850. In other words, for each state w in the state space S, the hardware module 700 calculates the survivor state and surviving path metric. The survivor state data is written into survivor state buffer 730 and the surviving path metric values are written into alternate error buffer 728. It is noted that path metric values are also referred to as error values.

When the hardware module 700 has finished calculating survivor state data and surviving metric values for each state in the state space, the hardware module 700 sends a completion signal to the software module. In response to the completion signal, in step 855, the software module copies the survivor state data from the survivor state buffer 730 to the survivor state array 450 in DSP memory 630. The software module maintains a count of the current sample being processed by the hardware module so that survivor state data may be copied to the correct portion of survivor state array. Recall that survivor state array is indexed by sample index as well as state number.

In step 860, the software module performs a test to determine if all samples have been processed. If not all samples have been processed, step 845 is iterated. If all samples have been processed, step 865 is performed.

In step 865, the software module reads the final path metric values from the alternate error buffer 728, and calculates the state w* with a minimum final path metric. In step 870, the software module reconstructs a symbol stream corresponding to the global optimum path by back-tracing the survivor states starting from the minimizing state w*. Finally, in step 880, the reconstructed symbol stream is decoded into speech sample data and the sample data is supplied to a D/A Converter. The D/A Converter generates an analog voice signal which is a replica of a transmitted voice signal.

The Software Module Elaborated

In step 825, the Software Module running on DSP 600 calculates combination values and branch product values based on the channel coefficients $\{h_0, h_1, h_2, h_3, h_4\}$ calculated in step 820. The software module calculates combination values $$C(v) = h_1 v_1 + h_2 v_2 + h_3 v_3 + h_4 v_4,$$

for all 256 states v in the state space S. The combination values are preferably calculated once per GSM burst, since the channel coefficients are estimated once per GSM burst. The combinations C(v) are stored in combination buffer 654 of the shared memory 650.

It is noted that the states in the state space S may be ordered by ordering the symbols in the symbol space $\Omega$. For example, one may order the symbols by assigning the binary digits 00 to the symbol "1", 01 to the symbol "j", 10 to the symbol "−1", and 11 to the symbol "−j". Then, each state $v = (v1, v2, v3, v4)$ has a binary representation $d_7 d_6 d_5 d_4 d_3 d_2 d_1 d_0$, where the digits $d_7 d_6$ represent the symbol v1, the digits $d_5 d_4$ represent the symbol v2, and so on. For example, the state $(1, -1, j, -j)$ is represented by the binary number 00100111. Thus, in the ordering given by the binary representation, the state $(1, -1, j, -j)$ is state number $32+4+2+1=39$.

In the preferred embodiment of the invention, the combination buffer 652 comprises 256 blocks ordered by state number. The block corresponding to state w stores the four combinations C(v) for the states v which send branches to w. It is noted that if state w has binary representation $d_7 d_6 d_5 d_4 d_3 d_2 d_1 d_0$, then the four states v which send branches to w will have a binary representation of the form $d_5 d_4 d_3 d_2 d_1 d_0 x_1 x_0$, where the digits $x_1 x_0$ are arbitrary. Thus, block number $d_7 d_6 d_5 d_4 d_3 d_2 d_1 d_0$ in the combination buffer 652 will contain combination values for the four states given by $d_5 d_4 d_3 d_2 d_1 d_0 x_1 x_0$ in the order given by digits $x_1 x_0$. In order to access combination values in the combination buffer 652, the hardware module 700 includes a state counter 712, a combination counter 713, and a combination address register 704. The state counter preferably comprises an eight bit counter which counts through the values from 0x00 to 0xFF. The combination counter preferably comprises a two bit counter which cycles through the values 00B to 11B.

In an alternate embodiment of the invention, the combination buffer 652 includes 256 entries, and the 256 combination values C(v) are stored in the combination buffer 652 in the order given by the binary representation of state v. Given a state w with binary representation $d_7 d_6 d_5 d_4 d_3 d_2 d_1 d_0$, the combinations C(v) for states v which send branches to w are stored in entries $d_5 d_4 d_3 d_2 d_1 d_0 x_1 x_0$, where the bits $x_1 x_0$ are arbitrary. Thus, the software module (or hardware module) may easily access the proper combinations for a survivor state calculation.

In step 825, the software module also calculates the branch product $(h_0 \cdot u)$ for all four symbols u in the symbol space $\Omega = \{\pm 1, \pm j\}$. These products are stored in the branch product buffer 654 of the shared memory 650. Again, the branch products $(h_0 \cdot u)$ are stored in the order given by the binary representation of symbol u. Similar to the combination values C(v), the branch products are calculated once per GSM frame.

In step 835, the software module performs the calculations associated with the first four stages of the Viterbi algorithm. Recall that the first four symbols of the symbol stream are known apriori. It follows that many of the states in state spaces $S_0$, $S_1$, $S_2$, and $S_3$ are not achieved by realizable paths and thus do not have a well defined path metric. Thus, it is advantageous to perform to Viterbi calculations for the first four stages in software. In state space $S_4$ and thereafter, every state will have a well defined path metric. Thus, after the fourth stage, the Viterbi calculations may be performed systematically and at higher speed in the hardware module 700.

In step 840, the software module stores the path metric values $e_4(w)$ for each state w of state space $S_4$ into error buffer 658. Thus, the error buffer 658 has 256 entries which are ordered according to state number.

The branch products and combinations are complex quantities each comprising a real and imaginary part. Thus, in the preferred embodiment of the invention, real and imaginary parts of a combination C(v) are stored in successive locations of the combination buffer 652. Likewise, real and imaginary parts of a branch product are stored in successive locations of the branch product buffer 654.

Hardware Module Architecture and Operation

FIG. 8 presents an architecture diagram of the hardware module 700. The hardware module 700 comprises: a combination address register 704 (CAR), a branch product address register 706 (BPAR), an error address register 708 (EAR), controller 710 [which includes Address Calculation Logic 711, State Counter 712, and Combination Counter 713], a real sample register 714 (RSR), a real combination register 716 (RCR), a real branch product register 718 (RBPR), an imaginary branch product register 720 (IBPR), an imaginary combination register 722 (ICR), an imaginary sample register 724 (ISR), an error value register 726 (EVR), an alternate error buffer 728, a survivor state buffer 730, and a compare and select unit 732.

In step 841, the software module writes (1) the start address of the combination buffer 652 to the combination address register 704, (2) the start address of the branch product buffer 654 to the branch product address register 706, and (3) the start address of the error buffer 658 to the error address register 708.

The state counter 712 and combination counter 713 together comprise a 10 bit counter. If the binary digits $d_7 d_6 d_5 d_4 d_3 d_2 d_1 d_0 x_1 x_0$ represent the value of the 10 bit counter, then the upper 8 bits $d_7 d_6 d_5 d_4 d_3 d_2 d_1 d_0$ are associated with the state counter 712 and the lower two digits $x_1 x_0$ are associated with the combination counter 713. The combination address register 704 specifies the location in combination buffer 652 which is to be next accessed. Each time the composite 10 bit counter is incremented, the CAR 704 is incremented by a value which represents the data length of a combination value. In response to control signals asserted by controller 710, the real and imaginary parts of a combination value stored in the combination buffer 652 are transferred to the real combination register 716 and the imaginary combination register 722 respectively. The combination value which is accessed is that pointed to by the CAR 704.

The branch product address register 706 specifies the location in combination buffer 652 which is to be next accessed. The BPAR 706 is controlled by the upper two bits $d_7 d_6$ of the state counter 712. For each increment of the counter comprised in the upper two bits $d_7 d_6$, the BPAR 706 is incremented by a value that represents the data length of a branch product. In response to control signals asserted by controller 710, the real and imaginary parts of a branch product value stored in the branch product buffer 654 are transferred to the real branch product register 718 and the imaginary branch product register 720 respectively. The branch product value which is accessed is that pointed to by the BPAR 706.

The error address register 708 specifies the location in error buffer 658 which is to be next accessed. The EAR 708 is controller by the last eight bits of the 10 bit counter, i.e. bits $d_5d_4d_3d_2d_1d_0x_1x_0$. Each time this eight bit counter value is incremented, the EAR 708 is incremented by a value which represents the data length of a stored error value (path metric value). In response to control signals asserted by the controller 710, an error value stored in the error buffer 658 is transferred to the error value register 726. The error value which is accessed is that pointed to by the error address register 708.

In view this discussion of the address registers, the processing cycle of the hardware module 700 may be explained. The processing cycle start with data loading. As described above, the data values pointed to the CAR 704, BPAR 706, and EAR 708 are loaded into the RCR 716, RBPR 718, IBPR 720, ICR 722, and EVR 726. Once these registers have been loaded, the controller 700 asserts signals (not shown) which gate the register values through a calculation network denoted by labels 740 through 747.

In subtractor 740, the value stored in RCR 716 is subtracted from the value stored in RSR 714. The result of subtractor 740 is supplied to subtractor 741. In subtractor 741, the value stored in RBPR 718 is subtracted from the result supplied from subtractor 740. The result from subtractor 741 is supplied to both inputs of multiplier 742. Thus, the output of multiplier 742 comprises the square of the result from subtractor 741. The squared value calculated by multiplier 742 is supplied to adder 746.

In subtractor 744, the value stored in ICR 722 is subtracted from the value stored in ISR 724. The result of subtractor 744 is supplied to subtractor 743. In subtractor 743, the value stored in IBPR 720 is subtracted from the result supplied from subtractor 744. The result from subtractor 743 is supplied to both inputs of multiplier 745. Thus, the output of multiplier 745 comprises the square of the result from subtractor 743. The squared value calculated by multiplier 743 is also supplied to adder 746.

In adder 746, the squared result from multiplier 742 and the squared result from multiplier 745 are added. The result of adder 746 is supplied to adder 747. In adder 747, the result from adder 746 and the value stored in EVR 726 are added together. The result of adder 747 is said to be a candidate path metric. The candidate path metric is supplied to compare and select unit 732.

For each value $d_7d_6d_5d_4d_3d_2d_1d_0x_1x_0$ of the 10 bit counter, new data is loaded and the calculation network produces a new candidate path metric. For each value of the state counter $d_7d_6d_5d_4d_3d_2d_1d_0$, the four candidate path metric values, corresponding to the four values 00, 01, 10, and 11 of combination counter $x_1x_0$, are compared in compare and select unit 732. The minimum of these four candidate path metrics is selected and stored in alternate error buffer 728 according to state number $d_7d_6d_5d_4d_3d_2d_1d_0$. In other words, entry number $d_7d_6d_5d_4d_3d_2d_1d_0$ of the alternate error buffer 728 contains the minimum path metric value. Thus, the alternate error buffer 728 includes 256 entries.

In the preferred embodiment, compare and select unit 732 includes a comparator and at least three registers: a first register for storing the path metric currently calculated by adder 747, a second register for storing the minimum path metric value, and a third register for storing the a representation of the minimizing state number. The comparator compares the current candidate path metric to the minimum path metric value. If the current candidate path metric is smaller than the minimum, the minimum is updated and the value of combination counter $x_1x_0$ is stored as the representation of the minimizing state number. If the current candidate path metric is not smaller than the minimum, the minimum is left unaltered. At the end of each combination counter cycle, i.e. after the fourth combination corresponding to combination count value $x_1x_0=11$ has been tested by the compare and select unit 732, the compare and select unit 732 dumps the minimizing path metric value to the alternate error buffer 728 and the minimizing state number to the survivor state buffer 730. The alternate error buffer 728 and survivor state buffer are indexed by state number $d_7d_6d_5d_4d_3d_2d_1d_0$.

In summary, the 10 bit counter counts through successive values from zero to 0x3FF. The current value of the 10 bit counter $d_7d_6d_5d_4d_3d_2d_1d_0x_1x_0$ determines the value of the CAR 704, BPAR 706, and the EAR 708, and these in turn determine the value of the ICR 716, RBPR 718, IBPR 720, ICR 722, and EVR 726. For each value of the 10 bit counter, a candidate path metric is generated. As the combination counter values $x_1x_0$ run through the four values 00, 01, 10, and 11, the compare and select unit 732 selects the minimum of the corresponding candidate path metric values, and stores the combination counter value $x_1x_0$ which corresponds to this minimum path metric is stored in the survivor state buffer 730. In addition, the minimum path metric value itself is stored in alternate error buffer 729. This minimization and survivor state calculation is performed iteratively for each value of state counter $d_7d_6d_5d_4d_3d_2d_1d_0$ running from 0x00 to 0XFF.

When the hardware module 700 has finished all 256 minimizations and survivor state calculations, it sends a completion signal to the software module. In response to the completion signal, the software module 865 reads survivor state data from the survivor state buffer to the survivor state array in DSP Memory 630.

What is claimed is:

1. A system for estimating a sequence of transmitted symbols from a first signal, wherein the first signal is received from a communication channel, the system comprising:
   a sampling device coupled to receive said first signal and configured to produce a sequence of samples of said first signal;
   a digital signal processor (DSP) configured:
   to calculate a set of channel coefficients which represent said communication channel;
   to calculate combination values for a plurality of states based on said channel coefficients, wherein each state of said plurality of states comprises an ordered collection of possible values for the transmitted symbols;
   a hardware module configured to receive a first sample of said sequence of samples and configured to calculate a survivor state value and a minimizing path metric value for each state of said plurality of states;
   wherein said survivor state value and said minimizing path metric value for each state of said plurality of states are used to estimate said sequence of transmitted symbols;
   wherein said hardware module is configured to access a plurality of stored error values, wherein said plurality of stored error values are used to calculate said survivor state value and said minimizing path metric value for each state of said plurality of states;

wherein said hardware module includes a state counter and a combination counter, wherein said state counter and combination counter are configured to control:
  a selection of a first combination value of said combination values;
  a selection of a first branch product value of said plurality of branch product values; and
  a selection of a first error value from said plurality of stored error values;
  wherein said first combination value, said first branch product value, and said first error value are used to determine said survivor state value and said minimizing path metric for one of said plurality of states.

2. The system of claim 1, wherein said DSP is further configured to calculate a plurality of branch product values according to the expression $h_0 a_k$, wherein the identifier $h_0$ represents a first channel coefficient of said channel coefficients, and wherein the number $a_k$ represents a candidate value for one of said transmitted symbol values, wherein said branch product values are used to calculate said survivor state value and said minimizing path metric value for each state of said plurality of states.

3. The system of claim 1, wherein said plurality of stored error values are pre-calculated by said DSP.

4. The system of claim 1, wherein said hardware module includes a calculation network, wherein said calculation network receives said first received sample, said first combination value, said first branch product value, and said first error value, and produces a first candidate path metric value, wherein said first candidate path metric value is used to determine said survivor state value and said minimizing path metric for said one of said plurality of states.

5. The system of claim 4, wherein said calculation network includes a first subtraction unit, wherein said first subtraction unit is configured to subtract at least a portion of a said first combination value from at least a portion of said first received sample, wherein a result obtained from said first subtraction unit is used to calculate said first candidate path metric value.

6. The system of claim 4, wherein said hardware module includes a compare and select unit, wherein said compare and select unit is configured:
  to compare a plurality of candidate path metric values which include said first candidate path metric value, wherein said plurality of candidate path metric values correspond to a current value of the state counter;
  to determine the minimum path metric value of said candidate path metric values;
  to capture the combination count value which achieves the minimum path metric, wherein said captured combination count value comprises said survivor state value for said one of said plurality of states.

7. The system of claim 5, wherein said calculation network includes a second subtraction unit, wherein said second subtraction unit is configured to subtract at least a portion of said first branch product value from said result obtained from said first subtraction unit, wherein a result obtained from said second subtraction unit is used to calculate said first candidate path metric value.

8. The system of claim 7, wherein said calculation network includes a multiplication unit, wherein a result obtained from said second subtraction unit is supplied to both inputs of said multiplication unit, wherein a result from said multiplication unit is used to calculate said first candidate path metric value.

9. The system of claim 7, wherein said DSP passes a first address to the hardware module, wherein the first address comprises a start address for the first memory buffer, wherein said hardware module reads said combination values from said first memory buffer based on said first address and said combination counter.

10. The system of claim 8, wherein said calculation network includes a first adder, wherein said first adder includes a real branch metric input value and an imaginary branch metric input value, wherein one of said real branch metric input value and said imaginary branch metric input value is provided with said result from said multiplication unit, wherein a result from said first adder is used to calculate said first candidate path metric value.

11. The system of claim 10, wherein said calculation network includes a second adder, wherein said second adder adds said first error value and said result obtained from said first adder, wherein a result from said second adder is used to calculate said first candidate path metric value.

12. The system of claim 1, where said DSP calculates said combination values according to the expression $$h_1 a_{k-1} + h_2 a_{k-2} + h_3 a_{k-3} + h_4 a_{k-4},$$

wherein identifiers $h_1$, $h_2$, $h_3$, and $h_4$ represent said channel coefficients, and numbers $a_{k-1}$, $a_{k-2}$, $a_{k-3}$, and $a_{k-4}$ represent the possible values which comprise one of said plurality of states.

13. The system of claim 1 further comprising a first memory buffer, wherein said DSP is configured to write said combination values into said first memory buffer, and wherein said hardware module is configured is read said combination values from said first memory buffer.

14. The system of claim 1, wherein said DSP is configured to copy the survivor state value for each state of said plurality of states from the hardware module to a survivor state array in response to a completion signal asserted by said hardware module.

15. The system of claim 14, wherein said DSP is configured to pass said sequence of samples to the hardware module, wherein the hardware module performs calculations associated with one stage of a Viterbi algorithm in response to each sample of said sequence.

16. The system of claim 15, wherein said DSP is configured to determine a global minimum path by back-tracing said survivor state array in response to said hardware module completing calculations associated with a last sample of said sequence of samples, wherein said DSP estimates said sequence of transmitted symbols based the states comprising said global minimum path.

17. A method for estimating a sequence of transmitted symbols from a first signal, wherein the first signal is received from a communication channel, the method comprising:
  sampling said first signal to produce a sequence of received samples;
  receiving a set of channel coefficients which represent said communication channel;
  calculating combination values for a plurality of states based on said channel coefficients, wherein each state of said plurality of states comprises an ordered collection of possible values for the transmitted symbols, wherein said calculating of combination values is performed in a digital signal processor (DSP);
  computing a survivor state value and a minimizing path metric value for each state of said plurality of states, wherein said computing a survivor state value and a minimizing path metric is perform by a hardware module in response to said hardware module receiving a first sample of said sequence of samples;

estimating said sequence of transmitted symbols using said survivor state value and said minimizing path metric for each state of said plurality of states;

said DSP calculating a plurality of branch product values according to the expression $h_0 a_k$, wherein the identifier $h_0$ represents a first channel coefficient of said channel coefficients, and wherein the number $a_k$ represents a candidate value for one of said transmitted symbol values;

said hardware module:
  accessing a plurality of stored error values;
  modifying a state count value and a combination count value;
  selecting a first combination value of said combination value, a first branch product value of said plurality of branch product values, and a first error value from said plurality of stored error values, wherein said selecting is controlled by said state count value and said combination count value;
  computing a candidate path metric based on said first combination value, said first branch product value, and said first error value; and
  comparing a plurality of candidate path metric values which correspond to the current state count value;
  determining the minimum path metric value of said candidate path metric values; and
  storing the combination count value which achieves the minimum path metric value, wherein said stored combination count value comprises said survivor state value.

18. The method of claim 17, further comprising said DSP pre-calculating said plurality of stored error values.

19. The method of claim 17, further comprising said DSP calculating said combination values according to the expression $$h_1 a_{k-1} + h_2 a_{k-2} + h_3 a_{k-3} + h_4 a_{k-4},$$

wherein identifiers $h_1$, $h_2$, $h_3$, and $h_4$ represent said channel coefficients, and numbers $a_{k-1}$, $a_{k-2}$, $a_{k-3}$, and $a_{k-4}$ represent the possible values which comprise one of said plurality of states.

20. The method of claim 17, further comprising said DSP passing said sequence of samples to the hardware module, said hardware module performing calculations associated with one stage of a Viterbi algorithm in response to each sample of said sequence.

* * * * *